(12) United States Patent
Chuang

(10) Patent No.: US 8,907,356 B2
(45) Date of Patent: Dec. 9, 2014

(54) LED PACKAGE STRUCTURE

(75) Inventor: Jui-Chien Chuang, New Taipei (TW)

(73) Assignee: Fleda Technology Corporation, New Taipei (TW)

(*) Notice: Subject to any disclaimer, the term of this patent is extended or adjusted under 35 U.S.C. 154(b) by 23 days.

(21) Appl. No.: 13/426,260

(22) Filed: Mar. 21, 2012

(65) Prior Publication Data

US 2013/0248888 A1    Sep. 26, 2013

(51) Int. Cl.
*H01L 33/08* (2010.01)
*H01L 27/00* (2006.01)

(52) U.S. Cl.
USPC ............... 257/88; 257/99; 257/98; 438/26; 438/27

(58) Field of Classification Search
CPC ........ H01L 33/08; H01L 33/48; H01L 224/01; H01L 27/00
USPC .............. 257/88, 98, 99; 438/26, 27
See application file for complete search history.

(56) References Cited

U.S. PATENT DOCUMENTS

| | | | | |
|---|---|---|---|---|
| 7,875,899 B2* | 1/2011 | Yasuda | ...................... | 257/99 |
| 8,047,679 B2* | 11/2011 | Wu et al. | ................... | 362/249.02 |
| 8,410,509 B2* | 4/2013 | Kim | ........................ | 257/98 |
| 2010/0327295 A1* | 12/2010 | Peng et al. | .................. | 257/88 |
| 2011/0303927 A1* | 12/2011 | Sanpei et al. | ................. | 257/88 |
| 2012/0217534 A1* | 8/2012 | Kamei et al. | ................. | 257/99 |
| 2012/0267645 A1* | 10/2012 | Lin et al. | ..................... | 257/88 |

* cited by examiner

*Primary Examiner* — Steven J Fulk
*Assistant Examiner* — Damon Hillman
(74) *Attorney, Agent, or Firm* — Muncy, Geissler, Olds & Lowe, P.C.

(57) ABSTRACT

An LED package structure comprises a 3D substrate, LED chips, wires, and resin encapsulants. The 3D substrate has a stepped contour and includes a first chip accommodation region and at least one second chip accommodation region surrounding the first chip accommodation region. A first electric contact and a second electric contact are arranged in the first chip accommodation region. The LED chips are arranged in the border of the 3D substrate. The wires are used to connect the LED chips in series or in series firstly and in parallel next. One of the wires connects the first electric contact and one of the LED chips. Another one of the wires connects the second electric contact and another one of the LED chips. The resin encapsulants respectively encapsulate the LED chips. The LED package structure is characterized in using a 3D substrate to facilitate wiring and increase the beam angle.

14 Claims, 4 Drawing Sheets

LED PACKAGE STRUCTURE

BACKGROUND OF THE INVENTION

1. Field of the Invention

The present invention relates to a package structure, particularly to an LED package structure.

2. Description of the Related Art

LED (Light-Emitting Diode) features durability, long service life and high power efficiency and thus has become the mainstream in the field of environmental protection and green energy.

The package structures of LED may be categorized into the single-chip package structure and the multi-chip package structure. In the single-chip package structure, a single LED chip is packaged into a point light-emitting element. When applied to illumination, a plurality of single-chip LED elements is installed in a substrate to obtain the required brightness. In the multi-chip package structure, several LED chips are packaged in a single substrate with a COB (Chip On Board) technology to form a planar light-emitting element. Although the multi-chip package structure is an improvement of the single-chip package structure, it is limited by structure design and fabrication technology and hard to have sufficient light-emitting area. Confronting the persistently growing market of LED illumination, how to improve the LED package structure has become an important topic in the field concerned.

SUMMARY OF THE INVENTION

The present invention is directed to an LED package structure, a 3D (3-Dimensional) substrate design can be utilized to facilitate wiring.

Another objective of the present invention is to provide an LED package structure to increase the beam angle of the LED package structure.

In one embodiment, the LED package structure of the present invention comprises a 3D substrate, a plurality of LED chips, a plurality of wires, and a plurality of resin encapsulants. The 3D substrate includes a first chip accommodation region and at least one second chip accommodation region surrounding the first chip accommodation region, whereby the 3D substrate has a stepped contour. In the 3D substrate, a first electric contact and a second electric contact are arranged in the first chip accommodation region. The LED chips are arranged in the border of the 3D substrate. The wires are used to connect the LED chips in series or connect the LED chips in series firstly and in parallel next. One of the wires electrically connects the first electric contact and one of the LED chips. Another one of the wires electrically connects the second electric contact and another one of the LED chips. The resin encapsulants respectively encapsulate the LED chips.

In one embodiment, the LED package structure of the present invention comprises a substrate, a plurality of LED chips, a plurality of wires, and a plurality of resin encapsulants. The substrate includes a first chip accommodation region and at least one second chip accommodation region surrounding the first chip accommodation region. In the substrate, a first electric contact and a second electric contact are arranged in the first chip accommodation region. The border of the substrate has a chamfer. The LED chips are arranged in the substrate. The wires are used to connect the LED chips in series or connect the LED chips in series firstly and in parallel next. One of the wires electrically connects the first electric contact and one of the LED chips. Another one of the wires electrically connects the second electric contact and another one of the LED chips. The resin encapsulants respectively encapsulate the LED chips.

Below, embodiments are described in detail with the attached drawings to make easily understood the objectives, technical contents, characteristics and accomplishments of the present invention.

DETAILED DESCRIPTION OF THE INVENTION

The embodiments described below are only to exemplify the present invention but not to limit the scope of the present invention.

Figure 1A:
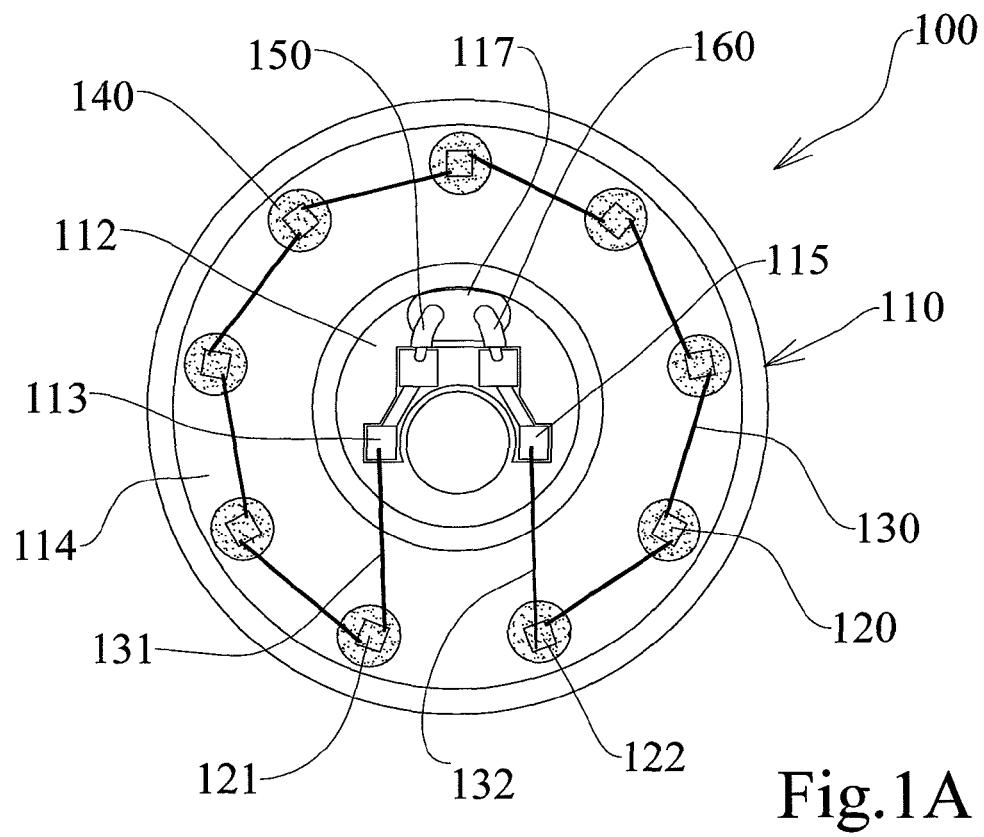
FIG. 1A and FIG. 1B are respectively a top view and a side view of an LED package structure according to one embodiment of the present invention.
Figure 1B:
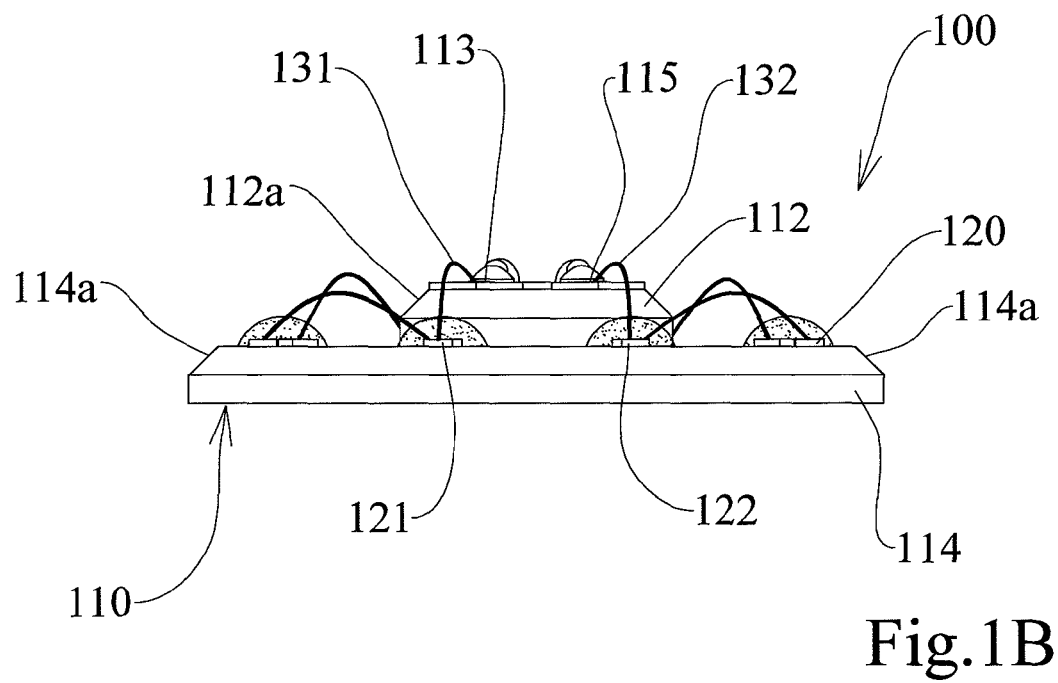

Refer to FIG. 1A and FIG. 1B respectively a top view and a side view of an LED package structure according to one embodiment of the present invention. As shown in FIG. 1A, the LED package structure 100 of the present invention comprises a 3D substrate 110, a plurality of LED chips 120, a plurality of wires 130, and a plurality of resin encapsulants 140. The 3D substrate 110 may be but is not limited to be a ceramic substrate, a copper substrate or an aluminum substrate. The 3D substrate 110 includes a first chip accommodation region 112 and at least one second chip accommodation region 114 surrounding the first chip accommodation region 112. In this embodiment, the first chip accommodation region 112 protrudes from the surface of the second chip accommodation region 114, whereby the 3D substrate 110 has a stepped contour, as shown in FIG. 1B. A first electric contact 113 and a second electric contact 115 are arranged in the first chip accommodation region 112. In the embodiment shown in FIG. 1A and FIG. 1B, the 3D substrate 110 has two steps. However, the present invention does not limit the number of the steps of the 3D substrate 110. The persons skilled in the art should understand that the number of the steps of the 3D substrate 110 depends on the size and application of the LED package structure.

Refer to FIG. 1A again. The LED chips 120 are arranged in the border of the 3D substrate 110. The wires 130 are used to connect the LED chips 120 in series or connect the LED chips 120 in series firstly and in parallel next. In the embodiment shown in FIG. 1A and FIG. 1B, the wires 130 are used to connect the LED chips 120 in series. The resin encapsulants 140 respectively encapsulate the LED chips 120 to protect the LED chips 120 from being polluted by external particles. Preferably, the resin encapsulants 140 are made of a transparent or semi-transparent material lest the light efficiency of the LED chips 120 be affected. As shown in FIG. 1A, one of the wires 130 (such as the wire 131) is electrically connected with one of the LED chips 120 (such as the LED chip 121) and the first electric contact 113; another one of the wires 130 (such as the wire 132) is electrically connected with one of the LED chips 120 (such as the LED chip 122) and the first electric contact 115.

Figure 2A:
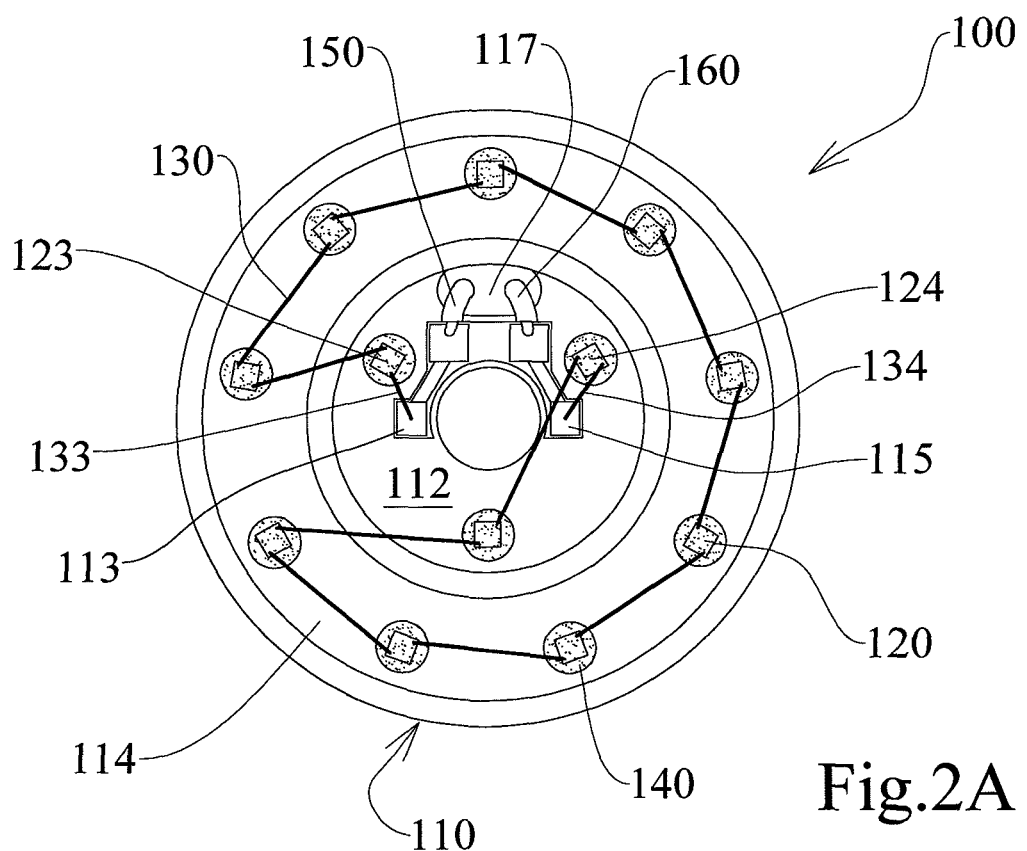
FIG. 2A and FIG. 2B are respectively a top view and a side view of an LED package structure according to another embodiment of the present invention.
Figure 2B:
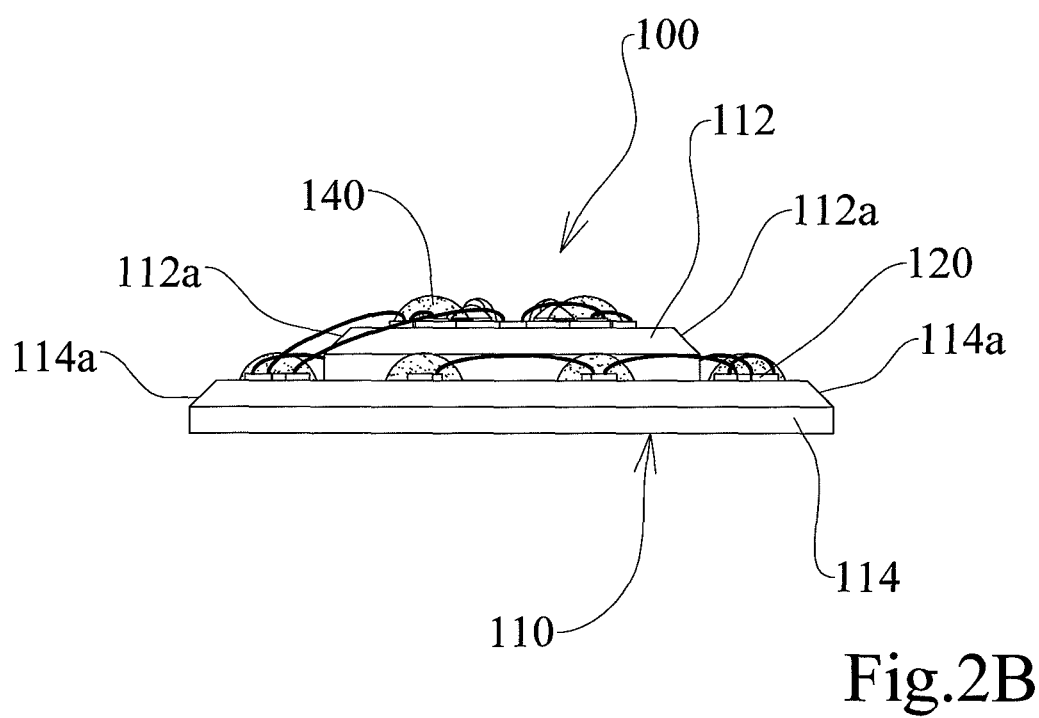

In one embodiment shown in FIG. 2A and FIG. 2B, a potion of the LED chips 120 are arranged in the border of the first chip accommodation region 112, and a portion of the LED chips 120 are arranged in the border of the second chip accommodation region 114. In the embodiment shown in FIG. 2A and FIG. 2B, one of the LED chips 120 arranged in the first chip accommodation region 112 (such as the LED chip 123) is connected with the first electric contact 113 via the wire 133; another one of the LED chips 120 arranged in the first chip accommodation region 112 (such as the LED chip 124) is connected with the second electric contact 115 via the wire 134.

Figure 3A:
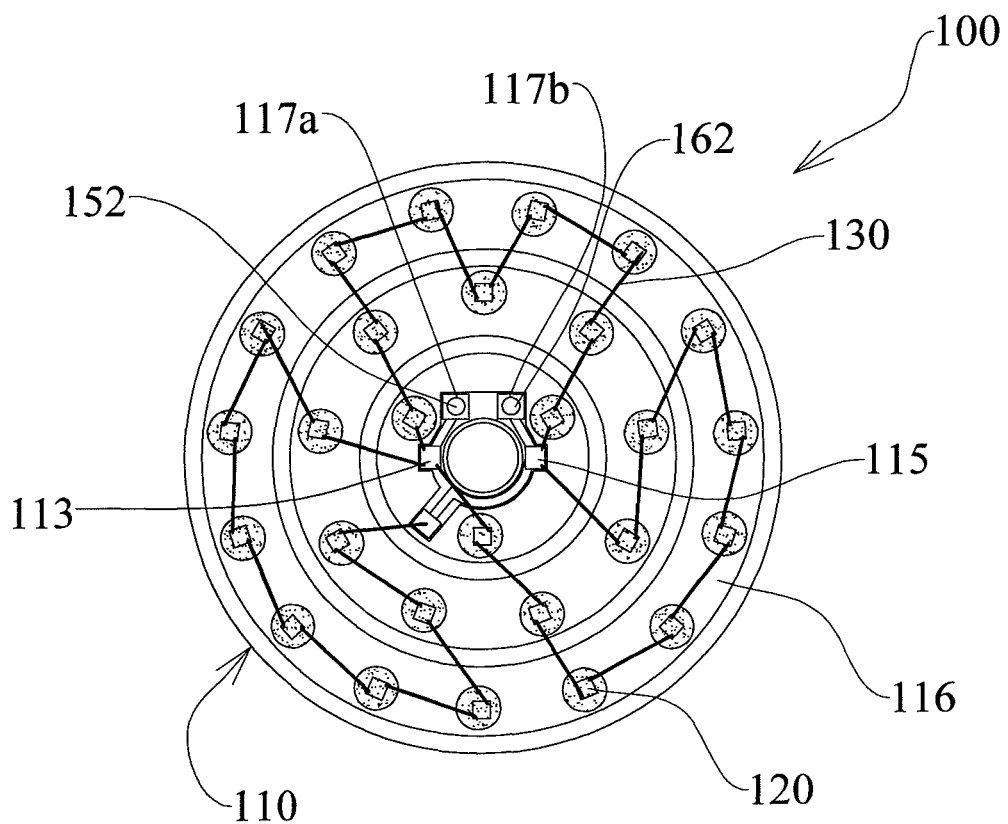
FIG. 3A and FIG. 3B are respectively a top view and a side view of an LED package structure according to yet another embodiment of the present invention.

Refer to FIG. 1A and FIG. 2A. At least one via-hole 117 is formed in the first chip accommodation region 112 and penetrates the 3D substrate 110. One end of a positive-electrode insertion member (such as a positive-electrode lead 150) passes through the via-hole 117 and electrically connects with the first electric contact 113. One end of a negative-electrode insertion member (such as a negative-electrode lead 160) passes through the via-hole 117 and electrically connects with the second electric contact 115. Thereby, electric power can be supplied to the LED package structure 100. In one embodiment shown in FIG. 3A and FIG. 3B, the 3D substrate 110 has a three-stepped contour, and the LED chips 120 are connected in series firstly and in parallel next. In order to meet the wiring design, the wires 130 may be used to electrically connect the LED chips 120 in different chip accommodation regions. In one embodiment shown in FIG. 3A and FIG. 3B, the positive-electrode insertion member is a positive-electrode pin 152, and the negative-electrode insertion member is a negative-electrode pin 162. The positive-electrode pin 152 and the negative-electrode pin 162 respectively pass through via-holes 117a and 117b to connect with the first electric contact 113 and the second electric contact 115 so as to supply electric power to the LED package structure 100.

Figure 3B:
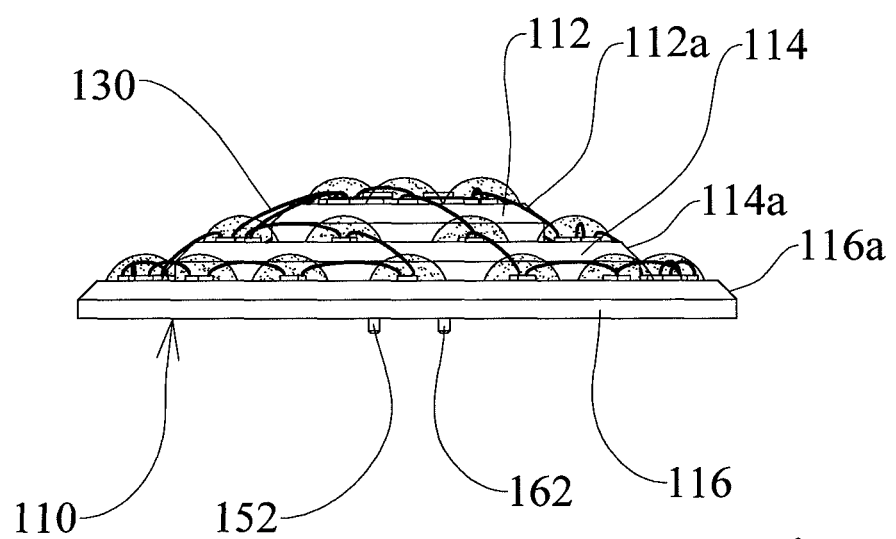

In the abovementioned embodiments, the stepped contour of the 3D substrate 110 facilitates wiring of the LED chips 120 connected in series/parallel. The 3D substrate 110 has a given thickness to facilitate heat radiation of the LED chips 120. Refer to FIG. 1B, FIG. 2B, and FIG. 3B. The first chip accommodation region 112 has a first chamfer 112a in the border thereof, and a plurality of LED chips 120 is arranged near the first chamfer 112a. The second chip accommodation regions 114 and 116 respectively have second chamfers 114a and 116a in the borders thereof, and a plurality of LED chips 120 are respectively arranged near the second chamfers 114a and 116a. Via arranging the LED chips 120 in the borders of the substrate having chamfer design, the LED package structure 100 of the present invention has a beam angle of as great as 270 degrees, which is much larger than the beam angle of 120-160 degrees of the conventional LED package structure.

Figure 4A:
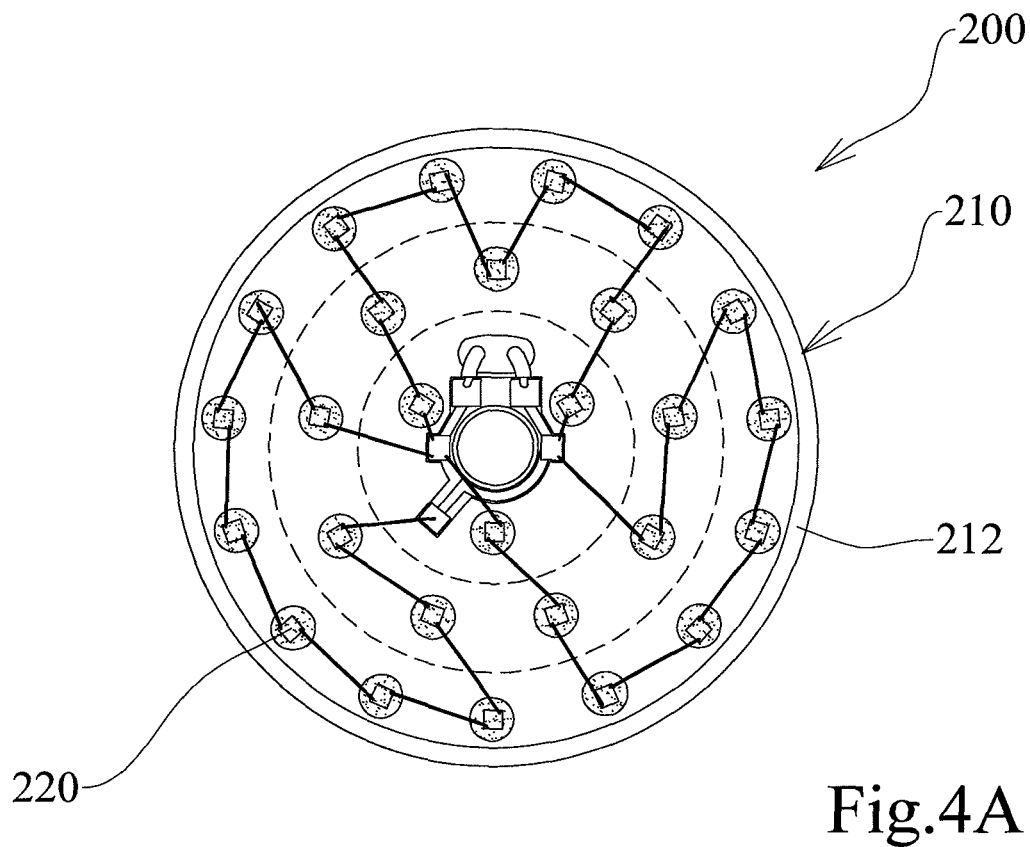
FIG. 4A and FIG. 4B are respectively a top view and a side view of an LED package structure according to a further embodiment of the present invention.
Figure 4B:
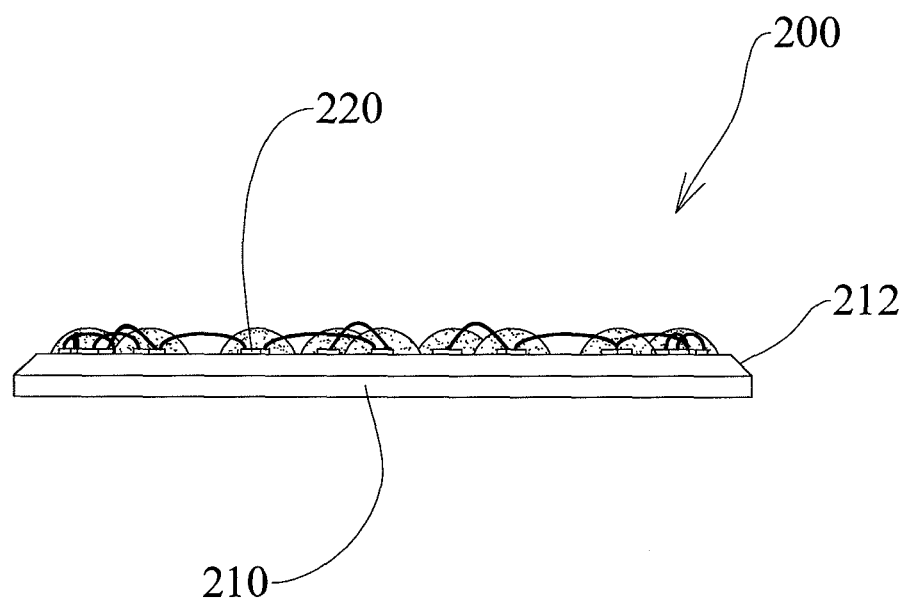

Refer to FIGS. 4A and 4B. In this embodiment, the present invention directly forms a chamfer in the border of the substrate so as to increase the beam angle. This embodiment is different from the abovementioned embodiments in that the substrate 210 of the LED package structure 200 is a planar structure. In this embodiment, a chamfer 212 is formed in the border of the substrate 210 so as to increase the beam angle of the LED chips 220.

The abovementioned embodiments demonstrate that present invention greatly increases the beam angle via varying the substrate structure. However, the present invention is not limited to the abovementioned embodiments. Any person skilled in the art should be able to derive other embodiments easily according to the spirit disclosed in the abovementioned embodiments.

In conclusion, the present invention proposes an LED package structure, which uses a 3D substrate to facilitate wiring and increase the beam angle. The embodiments described above are to demonstrate the technical thoughts and characteristics of the present invention to enable the persons skilled in the art to understand, make, and use the present invention. However, it is not intended to limit the scope of the present invention. Any equivalent modification or variation according to the spirit of the present invention is to be also included within the scope of the present invention.

What is claimed is:

1. A light-emitting diode package structure comprising: a 3-dimensional substrate including a first chip accommodation region and at least one second chip accommodation region surrounding said first chip accommodation region, and having a stepped contour, wherein a first electric contact and a second electric contact are arranged in said first chip accommodation region;

a plurality of light-emitting diode chips arranged m a border of said 3-dimensional substrate;

a plurality of wires electrically connecting said light-emitting diode chips in series or electrically connecting said light-emitting diode chips in series firstly and in parallel next, wherein one of said wires electrically connects said first electric contact and one of said light-emitting diode chips, and wherein a second wire from the plurality of wires electrically connects said second electric contact and a second light-emitting diode chip from the plurality of light-emitting diode chips arranged in a border of said 3-dimensional substrate;

wherein the 3D substrate has a stepped contour with at least two steps;

wherein the first chip accommodation region is a region on a first step of the 3D substrate and the second chip accommodation region is on a second different step of the 3D substrate;

wherein at least one via-hole is located in said first chip accommodation region and penetrates said 3-dimensional substrate, and that one end of a positive-electrode insertion member passes through said via-hole and electrically connects with said first electric contact, and that one end of a negative-electrode insertion member passes through said via-hole and electrically connects with second electric contact.

2. The light-emitting diode package structure according to claim 1, wherein a portion of said light-emitting diode chips are arranged near a border of said first chip accommodation region and that a portion of said light-emitting diode chips are arranged near a border of said second chip accommodation region.

3. The light-emitting diode package structure according to claim 2, wherein one of said light-emitting diode chips arranged in said first chip accommodation region is connected with said first electric contact and the second light-emitting diode chips arranged in said first chip accommodation region is connected with said second electric contact.

4. The light-emitting diode package structure according to claim 1, wherein said first chip accommodation region protrudes from a surface of said second chip accommodation region.

5. The light-emitting diode package structure according to claim 1, wherein said positive-electrode insertion member is a positive-electrode pin or a positive-electrode lead, and that said negative-electrode insertion member is a negative-electrode pin or a negative-electrode lead.

6. The light-emitting diode package structure according to claim 1, wherein said first chip accommodation region has a first chamfer in a border thereof, and that at least a portion of said light-emitting diode chips are arranged near said first chamfer.

7. The light-emitting diode package structure according to claim 1, wherein said second chip accommodation region has a second chamfer in a border thereof, and that at least a portion of said light-emitting diode chips are arranged near said second chamfer.

8. A light-emitting diode package structure comprising:
a substrate including a first chip accommodation region and at least one second chip accommodation region surrounding said first chip accommodation region, and having a chamfer in a border thereof, wherein a first electric contact and a second electric contact are arranged in said first chip accommodation region;
a plurality of light-emitting diode chips arranged in said substrate;
a plurality of wires electrically connecting said light-emitting diode chips in series or electrically connecting said light-emitting diode chips in series firstly and in parallel next, wherein one of said wires electrically connects said first electric contact and one of said light-emitting diode chips, and a second wire from the plurality of wires electrically connects said second electric contact and a second light-emitting diode chip from the plurality of light-emitting diode chips arranged in a border of said 3-dimensional substrate;
wherein at least one via-hole is located in said first chip accommodation region and penetrates said substrate, and that one end of a positive-electrode insertion member passes through said via-hole and electrically connects with said first electric contact, and that one end of a negative-electrode insertion member passes through said via-hole and electrically connects with said second electric contact, and that said positive-electrode insertion member is a positive-electrode pin or a positive-electrode lead, and that said negative-electrode insertion member is a negative-electrode pin or a negative-electrode lead.

9. The light-emitting diode package structure according to claim 1, wherein the plurality of light-emitting diode chips are packaged on the single substrate with a COB (Chip on Board) technology.

10. The light-emitting diode package structure according to claim 8, wherein the plurality of light-emitting diode chips are packaged on the single substrate with a COB (Chip on Board) technology.

11. The light-emitting diode package structure according to claim 1, wherein the plurality of light-emitting diode chips form a planar light-emitting element.

12. The light-emitting diode package structure according to claim 8, wherein the plurality of light-emitting diode chips form a planar light-emitting element.

13. The light emitting diode package structure according to claim 1, wherein a plurality of resin encapsulants respectively encapsulate said plurality of light-emitting diode chips.

14. The light emitting diode package structure according to claim 8, wherein a plurality of resin encapsulants respectively encapsulate said plurality of light-emitting diode chips.

* * * * *